United States Patent
Mathuni et al.

(10) Patent No.: US 6,919,147 B2
(45) Date of Patent: Jul. 19, 2005

(54) PRODUCTION METHOD FOR A HALFTONE PHASE MASK

(75) Inventors: Josef Mathuni, Munich (DE); Gunther Ruhl, Dorfen (DE)

(73) Assignee: Infineon Technologies AG, München (DE)

( * ) Notice: Subject to any disclaimer, the term of this patent is extended or adjusted under 35 U.S.C. 154(b) by 410 days.

(21) Appl. No.: 10/254,405

(22) Filed: Sep. 25, 2002

(65) Prior Publication Data

US 2004/0058252 A1 Mar. 25, 2004

(51) Int. Cl.$^7$ .............................. G03F 1/08; C23F 1/00
(52) U.S. Cl. ............................................. 430/5; 216/12
(58) Field of Search ................................. 430/5; 216/12

(56) References Cited

U.S. PATENT DOCUMENTS 6,045,954 A * 4/2000 Dai et al. ..................... 430/5

* cited by examiner

Primary Examiner—Geraldine Letscher
(74) Attorney, Agent, or Firm—Jenkins, Wilson & Taylor, P.A.

(57) ABSTRACT

The present invention provides a production method for a halftone phase mask which has an $SiO_2$ substrate, an overlying refractory metal $Si_xN_y$ phase shifter layer (2) and an overlying chromium oxide or chromium mask layer (3), having the following steps: provision of a mask (4) on the chromium oxide or chromium mask layer (3); etching of the chromium oxide or chromium mask layer (3) for the purpose of forming a hard mask from the chromium oxide or chromium mask layer (3) in a first etching step; selective etching of the refractory metal $Si_xN_y$ phase shifter layer (2) using the hard mask in a plasma with a chlorine-containing and/or hydrogen-chloride-containing main gas in a second etching step with a predetermined cathode power of at least 20 W.

15 Claims, 1 Drawing Sheet

PRODUCTION METHOD FOR A HALFTONE PHASE MASK

The invention relates to a production method for a halftone phase mask.

J. Electrochem. Soc. 135 (1988), pages 2373–2378, discloses an anisotropic reactive ion etching process of $MoSi_2$ using $Cl_2$ and $BCl_3$, it being mentioned that fluorine-containing gases and/or oxygen can be added to the etching gas.

J. Electrochem Soc. 131 (1984), pages 375–380, likewise describes the etching of $MoSi_2$ by means of various chlorine compounds which act selectively.

In order to produce halftone phase masks, the phase shifter layer made of $Si_xN_y$ with a doping of typically 0–20 atom % of refractory metals (e.g. Mo, Ta, . . . ), for example an Mo—$Si_xN_y$ phase shifter layer, is patterned by means of plasma etching using a chromium or chromium oxide mask (normally chromium/chromium dioxide double layer) or a chromium or chromium oxide mask coated with resist (photo-, x-ray, electron or ion lithography resist) (DE 196 32 845 A1; B. W. Smith, J. Vac. Sci. Technol. B15 (6) (1997), pages 2259–2262; B. W. Smith, J. Vak. Sci. Technol. B14 (6) (1996), pages 3719–3723).

In this case, what is of crucial importance for the phase shifter properties of the mask is that the underlying $SiO_2$ glass substrate is incipiently etched only to a very small extent. This necessitates a high selectivity of the plasma etching process. Furthermore, no dimensional loss is to occur in the course of the ever decreasing minimum feature sizes. In other words, no undercut of the phase shifter layer under the masking chromium layer is to take place. Furthermore, lateral incipient etching of the chromium or chromium oxide mask is not permitted to take place.

To date it has only been possible either to achieve a low etching selectivity or to accept a dimensional loss. Generally, use is made of fluorine-containing gases for producing etching plasmas for these materials. A high selectivity (>3:1) is achieved by the use of low-polymer etching chemicals such as e.g. $SF_6$, the cathode power (RF bias) of the plasma etcher being low.

However, these etching processes are predominantly isotropic and therefore exhibit a pronounced undercutting behavior of the chromium or chromium oxide mask and thus a high dimensional loss.

An undercut is avoided by the use of high-polymer etching chemicals such as e.g. $CHF_3/O_2$ or $CF_4/O_2$ at a higher cathode power of typically >50 W.

As a result, however, these processes exhibit a poor etching selectivity (<2:1) with respect to the $SiO_2$ substrate, which makes the process difficult to control. In the event of excessively great etching removal of the $SiO_2$ substrate, the resulting phase angle of the $SiO_2$/refractory metal $Si_xN_y$ transition moves outside the required tolerance (C. Constantine, SPIE Vol. 3546 (1998), 88–96; J. Plumhoff, SPIE Vol. 4562 (2002) 694–703).

Experiments using $CF_4/O_2$/He with admixture of small quantities of chlorine ($Cl_2$) resulted in a disadvantageous behavior with regard to an etching attack on the chromium oxide or chromium mask and a resultant widening of the structure width (S. J. Choi, SPIE Vol. 4562 (2002), pages 561–570).

The combination of high-polymer etching chemicals and low-polymer etching chemicals also does not provide an adequate remedy with regard to the undercuts of the chromium layer.

It is an object of the present invention to specify a method which can be used to produce a halftone phase mask with refractory metal $Si_xN_y$ phase shifter layer with a high etching selectivity and with no dimensional loss.

This object is achieved according to the invention by means of the method according to claim 1.

The solution according to the invention is based on the use of a plasma etching chemical based on chlorine and/or hydrogen chloride as main gas with an increased cathode power.

As a result, with a high etching selectivity with respect to $SiO_2$, an undercut of the chromium oxide or chromium mask [lacuna] a dimensional loss is avoided. In contrast to fluorine-containing plasmas, chlorine or hydrogen chloride plasmas do not react spontaneously with the refractory metal $Si_xN_y$ phase shifter layer, but rather only upon application of a specific cathode power >20 W, i.e. at a specific minimum energy of the ions. An anisotropic etching characteristic is achieved as a result.

At the same time, a polymer-free plasma or, in the case of chromium oxide or chromium masks coated with photoresist, a low-polymer plasma is present here, so that the $SiO_2$ etching rate is lowered, which affords the advantage of a high etching selectivity (>3:1). In addition, the chromium oxide or chromium mask is not incipiently etched laterally, as a result of which a dimensional loss is avoided. Moreover, a subsequent resist removal is simplified in contrast to polymer-containing fluorine plasmas.

In order to improve the selectivity, the edge form and the uniformity of the etching, further gases can be added to the chlorine plasma or the hydrogen chloride plasma or the plasma comprising a mixture of chlorine and hydrogen chloride.

Said gases are primarily inert gases, such as e.g. the noble gases He and Ar or nitrogen, or they are polymer-containing gases, such as e.g. $CH_4$, and fluorine-containing gases, such as e.g. $SF_6$, and hydrogen in small quantities. Furthermore, $O_2$ can be added in small quantities (of about 1 vol %).

With no or with only small additions of $O_2$, when etching using chlorine compounds, no volatile chromium oxychlorides are formed, and chromium can serve as a mask (hard mask) for etching the refractory metal $Si_xN_y$ phase shifter layer. The selectivity with respect to the chromium oxide or chromium mask becomes so high, by largely omitting $O_2$, that the photoresist can also optionally be removed after the chromium oxide or chromium etching and the chromium oxide or chromium alone then serves as mask.

A further advantage of the process according to the invention is that the etching process for the patterning of the refractory metal $Si_xN_y$ phase shifter layer can be carried out in the same etching reactor as the etching process for the patterning of the chromium oxide or chromium mask.

The subclaims relate to preferred embodiments of the invention.

In accordance with one preferred development, the first etching step is carried out in a plasma in the same chamber.

In accordance with a further preferred development, oxygen is added to the plasma during the selective etching in small quantities of preferably 1 percent by volume.

In accordance with a further preferred development, at least one inert gas is added to the plasma.

In accordance with a further preferred development, the at least one inert gas comprises at least one of the noble gases He and Ar.

In accordance with a further preferred development, the at least one inert gas comprises nitrogen.

In accordance with a further preferred development, polymer-containing gases are added to the plasma.

In accordance with a further preferred development, the polymer-containing gases comprise $CH_4$.

In accordance with a further preferred development, fluorine-containing gases are added to the plasma in small quantities.

In accordance with a further preferred development, the fluorine-containing gases comprise $SF_6$.

In accordance with a further preferred development, polymer-containing and fluorine-containing gases are added to the plasma in small quantities.

In accordance with a further preferred development, the polymer-containing and fluorine-containing gases comprise $CHF_3$.

In accordance with a further preferred development, the mask is a photoresist mask and is left on the hard mask during the selective etching.

In accordance with a further preferred development, the etching is effected at a predetermined cathode power of between 50 W and 300 W in the first etching step, and at a predetermined cathode power of between 20 W and 100 W in the second etching step.

In accordance with a further preferred development, the etching is effected at a predetermined pressure of between 0.2 Pa and 1 Pa in the first etching step, and at a predetermined pressure of between 0.2 Pa and 2 Pa in the second etching step.

Further features and advantages of the invention emerge from the following description of a preferred exemplary embodiment, in which reference is made to the accompanying drawings.

FIGS. 1A to 1D in each case show the cross section through layers of mask blank with an $SiO_2$ substrate 1, an M—$Si_xN_y$ phase shifter layer 2 and a chromium/chromium oxide double layer, which is designated as chromium layer 3 for the sake of simplicity. A desired pattern for the production of a halftone phase mask (attenuated phase mask or the like) for the use for the exposure of wafers is produced in the Mo—$Si_xN_y$ phase shifter layer 2 and the chromium layer 3. For its part, said pattern is produced by exposure of the mask blank.

To that end, a layer 4 of photoresist is applied on the chromium layer 3 (by spin-on coating or the like), and is exposed, developed and rinsed in order, after the chromium layer 3 has been etched, to remove the then uncovered regions of the Mo—$Si_xN_y$ phase shifter layer 2 in a chlorine plasma.

Figure 1A:
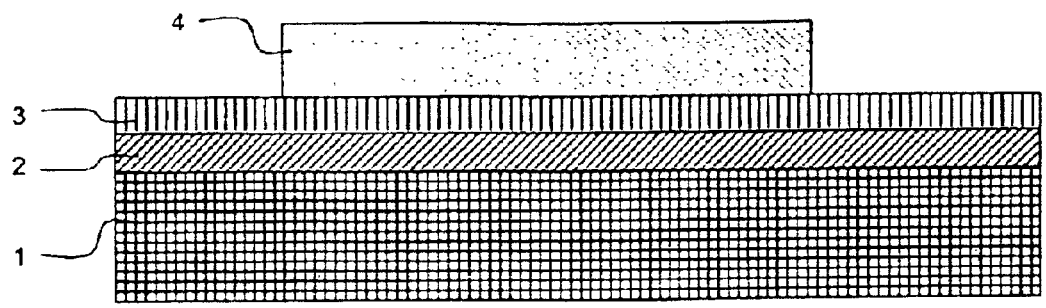
FIG. 1A shows a cross section through the halftone phase mask after exposure and development.
Figure 1B:
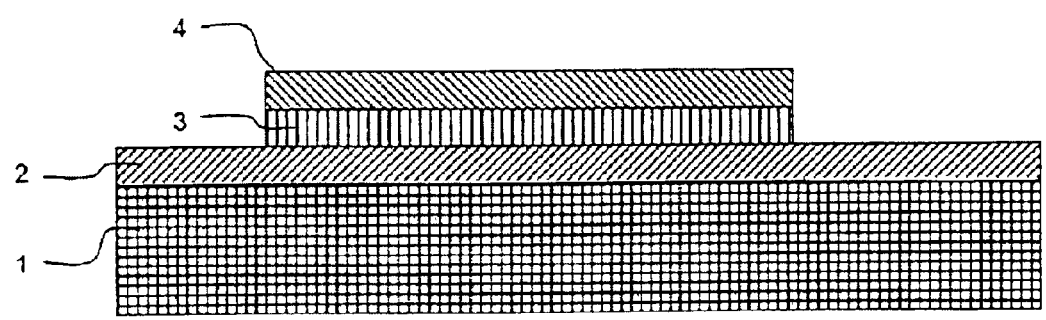
FIG. 1B shows the cross section through the halftone phase mask after the etching of the chromium.
Figure 1C:
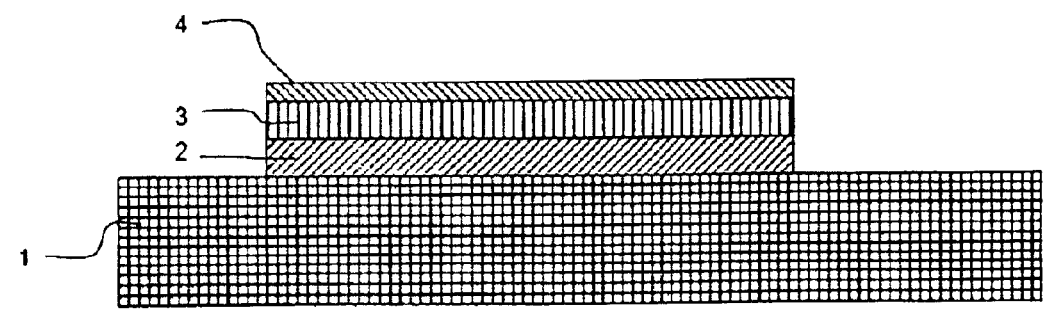
FIG. 1C shows the cross section through the halftone phase mask after the etching of the Mo—$Si_xN_y$ phase shifter layer.
Figure 1D:
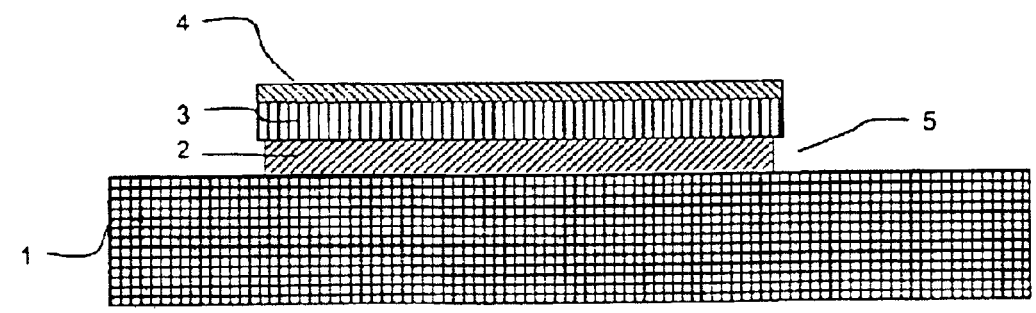
FIG. 1D shows a cross section through the halftone phase mask after the conventional $SF_6$ overetch etching of an Mo—$Si_xN_y$ phase shifter layer.

FIG. 1D shows the result of such a method using the conventional, low-polymer etching gases such as $SF_6$. By means of these low-polymer etching chemicals, a high selectivity with respect to $SiO_2$ of more than 3:1 is achieved with a low cathode power (RF bias) of the plasma etcher. However, the disadvantage of these etching processes is that the etching is at least partly effected isotropically and pronounced undercuts of the chromium mask therefore occur. Such an undercut 5 is shown in FIG. 1D. These undercuts 5 mean a high dimensional loss with the consequence that the structure that is later imaged onto the wafer using the halftone phase mask is no longer well defined and errors can therefore arise on the wafer: the halftone phase mask thus produced can only be used to a limited extent.

Therefore, in the case of the plasma etching method according to the invention for the production of a halftone phase mask, the pattern is etched in the Mo—$Si_xN_y$ phase shifter layer 2 using a chlorine compound with a predetermined cathode power of at least 20 W. The plasma etching chemical based on chlorine as main gas is sufficiently anisotropic, so that an undercut of the chromium layer 3 and thus a dimensional loss is avoided during the etching of the Mo—$Si_xN_y$ phase shifter layer 2. Since, in contrast to the fluorine plasmas used hitherto, the chlorine plasmas do not react spontaneously with the Mo—$Si_xN_y$ phase shifter layer, according to the invention a cathode power of more than 20 W is coupled into the plasma etching reactor, i.e. the ions are thus brought to a minimum energy.

The anisotropic plasma etching using chlorine compounds of the method according to the invention without polymers stops on the $SiO_2$ layer 1, so that a high selectivity (dependent on the ion energy) is achieved, the plasma being low in polymers despite the chromium mask 3 that is still coated with resist 4 in this example.

As an example of the method according to the invention in an ICP etching reactor, parameters for the etching process are specified in Table 1 below.

TABLE 1

| Etching gas | 1–100 sccm* $Cl_2$ |
|---|---|
|  | 0–200 sccm He |
| Cathode power (bias power) | 20–300 W |
| ICP power (source power) | 0–1000 W |
| Pressure | Approx. 0.15–15 Pa |
|  | (1–100 mTorr) |

*$cm^3$/minute under standard conditions

The etching is effected in two steps in the present example.

In a first step of the plasma etching method for etching the chromium, the cathode power (bias power) is set to a value of between 50 and 300 W, and the pressure in the etching chamber is between 0.2 and 1 Pa, for example.

In the subsequent second step of the plasma etching method for etching the Mo—$Si_xN_y$ phase shifter layer, the cathode power is then set to a value of between 20 and 100 W, and the pressure in the etching chamber is between 0.2 and 2 Pa, for example.

In the first step, on account of the higher cathode power, a higher anisotropy is ensured during the etching (the edges of the etched chromium structures become steeper), and in the second step, with the lower cathode power, a good selectivity is ensured during the etching (the quartz substrate is incipiently etched only to a minimal extent).

As can be seen from FIGS. 1A to 1C, the resist 4 is thinned during each etching step. Therefore, the chromium 3 serves as the actual mask for the etching of the Mo—$Si_xN_y$ phase shifter layer 2, even if residual resist 4 from the etching of the chromium 3 is still present.

The method according to the invention thus allows the anisotropic etching of a refractory metal $Si_xN_y$ phase shifter layer with no dimensional loss to be combined with a high etching selectivity with respect to the $SiO_2$ substrate by the use of a chlorine-based etching chemical with increased cathode power.

What is claimed is:

1. Production method for a halftone phase mask which has an $SiO_2$ substrate, an overlying refractory metal $Si_xN_y$ phase shifter layer (2) and an overlying chromium oxide or chromium mask layer (3), having the following steps:

provision of a mask (4) on the chromium oxide or chromium mask layer (3);

etching of the chromium oxide or chromium mask layer (3) for the purpose of forming a hard mask from the chromium oxide or chromium mask layer (3) in a first etching step;

selective etching of the refractory metal $Si_xN_y$ phase shifter layer (2) using the hard mask in a plasma with a chlorine-containing and/or hydrogen-chloride-containing main gas in a second etching step with a predetermined cathode power of at least 20 W.

2. Production method for a halftone phase mask according to claim 1, the first etching step being carried out in a plasma in the same chamber.

3. Production method for a halftone phase mask according to claim 1 or 2, oxygen being added to the plasma during the selective etching in small quantities of preferably 1 percent by volume.

4. Production method for a halftone phase mask according to claim 1, 2 or 3, at least one inert gas being added to the plasma.

5. Production method for a halftone phase mask according to claim 4, in which the at least one inert gas comprises at least one of the noble gases He and Ar.

6. Production method for a halftone phase mask according to claim 4, the at least one inert gas comprising nitrogen.

7. Production method for a halftone phase mask according to claim 1, polymer-containing gases being added to the plasma.

8. Production method for a halftone phase mask according to claim 7, the polymer-containing gases comprising $CH_4$.

9. Production method for a halftone phase mask according to claim 1, fluorine-containing gases being added to the plasma in small quantities.

10. Production method for a halftone phase mask according to claim 9, the fluorine-containing gases comprising $SF_6$.

11. Production method for a halftone phase mask according to claim 1, polymer-containing and fluorine-containing gases being added to the plasma in small quantities.

12. Production method for a halftone phase mask according to claim 11, the polymer-containing and fluorine-containing gases comprising $CHF_3$.

13. Production method for a halftone phase mask according to one of the preceding claims, the mask (4) being a photoresist mask and being left on the hard mask during the selective etching.

14. Production method for a halftone phase mask according to one of the preceding claims 2 to 13, the etching being effected at a predetermined cathode power of between 50 W and 300 W in the first etching step, and at a predetermined cathode power of between 20 W and 100 W in the second etching step.

15. Production method for a halftone phase mask according to claim 11, the etching being effected at a predetermined pressure of between 0.2 Pa and 1 Pa in the first etching step, and at a predetermined pressure of between 0.2 Pa and 2 Pa in the second etching step.

* * * * *